US012592721B2

(12) United States Patent
Mermel et al.

(10) Patent No.: US 12,592,721 B2
(45) Date of Patent: Mar. 31, 2026

(54) DATA COMPRESSION FOR NEURAL SYSTEMS

(71) Applicant: PRECISION NEUROSCIENCE CORPORATION, New York, NY (US)

(72) Inventors: Craig Mermel, Los Gatos, CA (US); Benjamin Rapoport, New York, NY (US); Daniel Trietsch, New York, NY (US); Mark Murphy, Chicago, IL (US); Elton Ho, Mountain View, CA (US); Kostandinos Hatzianestis, Mountain View, CA (US); Manuel Monge, Minneapolis, MN (US)

(73) Assignee: PRECISION NEUROSCIENCE CORPORATION, New York, NY (US)

( * ) Notice: Subject to any disclaimer, the term of this patent is extended or adjusted under 35 U.S.C. 154(b) by 28 days.

(21) Appl. No.: 18/590,243

(22) Filed: Feb. 28, 2024

(65) Prior Publication Data

US 2024/0291504 A1     Aug. 29, 2024

Related U.S. Application Data

(60) Provisional application No. 63/487,394, filed on Feb. 28, 2023.

(51) Int. Cl.
*H03M 7/30* (2006.01)

(52) U.S. Cl.
CPC .................................... *H03M 7/70* (2013.01)

(58) Field of Classification Search
CPC ..... H03M 7/70; H03M 7/6088; H03M 7/6094
(Continued)

(56) References Cited

U.S. PATENT DOCUMENTS 5,709,689 A     1/1998   Ferrante et al.
5,910,282 A     6/1999   Gorzdanovski et al.
(Continued)

FOREIGN PATENT DOCUMENTS

AU     2020428944 A1     9/2022
AU     2024203319 A1     6/2024
(Continued)

OTHER PUBLICATIONS

Alim S.A., et al., "Some Commonly Used Speech Feature Extraction Algorithms," IntechOpen, 2018, vol. 1, 18 pages.
(Continued)

*Primary Examiner* — Peguy Jean Pierre
(74) *Attorney, Agent, or Firm* — DLA Piper LLP US

(57) ABSTRACT

A system for compressing neural signal data using spatiotemporal data compression techniques. The system includes an implantable neural that receives electrophysiologic signal data from the electrode array, maps the electrophysiologic signal data to locations of each of the plurality of the electrodes, and compresses the mapped electrophysiologic signal data based on the locations of the plurality of electrodes utilizing a spatiotemporal data compression algorithm to define compressed electrophysiologic signal data. The implantable neural device can be connectable to a computer system that decompressed the electrophysiologic data for various downstream applications.

14 Claims, 13 Drawing Sheets

(58) Field of Classification Search
USPC ........................................ 341/87, 97, 98, 50
See application file for complete search history.

(56) References Cited

U.S. PATENT DOCUMENTS

| | | | |
|---|---|---|---|
| 6,831,991 | B2 | 12/2004 | Fridrich et al. |
| 7,389,144 | B1 | 6/2008 | Osorio et al. |
| 7,818,061 | B1 | 10/2010 | Palmer |
| 7,925,350 | B1 | 4/2011 | Palmer |
| 8,156,568 | B2 | 4/2012 | Gaitas et al. |
| 8,170,670 | B2 | 5/2012 | Stubbs et al. |
| 8,515,538 | B1 | 8/2013 | Osorio et al. |
| 8,516,568 | B2 | 8/2013 | Cohen |
| 8,546,568 | B2 | 10/2013 | Inouye et al. |
| 8,634,918 | B2 | 1/2014 | Chambers |
| 9,314,618 | B2 | 4/2016 | Imran et al. |
| 9,549,704 | B1 | 1/2017 | Buerger et al. |
| 10,135,849 | B2 | 11/2018 | Jha et al. |
| 10,265,081 | B2 | 4/2019 | Kennedy et al. |
| 10,363,420 | B2 | 7/2019 | Fried et al. |
| 11,013,923 | B1 | 5/2021 | Eubanks |
| 11,185,684 | B2 | 11/2021 | Cadwell |
| 11,640,204 | B2 | 5/2023 | Shenoy et al. |
| 12,008,987 | B2 | 6/2024 | Stavisky et al. |
| 2001/0054758 | A1 | 12/2001 | Isaak |
| 2003/0057506 | A1 | 3/2003 | Li et al. |
| 2005/0228421 | A1 | 10/2005 | Bilenski et al. |
| 2005/0261934 | A1 | 11/2005 | Thompson |
| 2006/0015153 | A1 | 1/2006 | Gliner et al. |
| 2006/0106431 | A1 | 5/2006 | Wyler et al. |
| 2006/0253163 | A1 | 11/2006 | Stubbs et al. |
| 2007/0005691 | A1 | 1/2007 | Pushparaj |
| 2007/0282398 | A1 | 12/2007 | Healey et al. |
| 2009/0082829 | A1 | 3/2009 | Panken et al. |
| 2009/0088763 | A1 | 4/2009 | Aram et al. |
| 2009/0132061 | A1 | 5/2009 | Stubbs et al. |
| 2009/0312817 | A1 | 12/2009 | Hogle et al. |
| 2011/0093052 | A1 | 4/2011 | Anderson et al. |
| 2011/0245835 | A1 | 10/2011 | Dodds et al. |
| 2012/0139269 | A1 | 6/2012 | Kouzuma |
| 2012/0277834 | A1 | 11/2012 | Mercanzini et al. |
| 2012/0302959 | A1 | 11/2012 | Fielder et al. |
| 2013/0014982 | A1 | 1/2013 | Segawa et al. |
| 2013/0144362 | A1 | 6/2013 | Lee |
| 2013/0144365 | A1 | 6/2013 | Kipke et al. |
| 2013/0331856 | A1 | 12/2013 | Sage |
| 2014/0051960 | A1 | 2/2014 | Badower et al. |
| 2014/0100586 | A1 | 4/2014 | Pianca et al. |
| 2014/0185805 | A1 | 7/2014 | Andersen |
| 2014/0194944 | A1 | 7/2014 | Romanelli et al. |
| 2015/0111930 | A1 | 4/2015 | Aung-Din |
| 2015/0151114 | A1 | 6/2015 | Black et al. |
| 2015/0265180 | A1 | 9/2015 | Venkatesan et al. |
| 2015/0367122 | A1 | 12/2015 | Morshed et al. |
| 2016/0007874 | A1 | 1/2016 | Ma et al. |
| 2016/0120457 | A1 | 5/2016 | Wu et al. |
| 2016/0174863 | A1* | 6/2016 | Foerster ................. A61B 5/291 |
| | | | 600/544 |
| 2016/0331994 | A1 | 11/2016 | Smith et al. |
| 2017/0001003 | A1 | 1/2017 | Pivonka et al. |
| 2017/0100580 | A1 | 4/2017 | Olson |
| 2017/0108926 | A1 | 4/2017 | Moon et al. |
| 2017/0113046 | A1 | 4/2017 | Fried et al. |
| 2017/0224980 | A1* | 8/2017 | Grasso ............... A61N 1/36036 |
| 2017/0235663 | A1 | 8/2017 | Kattepur et al. |
| 2017/0246452 | A1 | 8/2017 | Liu et al. |
| 2017/0259072 | A1 | 9/2017 | Newham et al. |
| 2018/0078767 | A1 | 3/2018 | Rapoport et al. |
| 2018/0236221 | A1 | 8/2018 | Opie et al. |
| 2018/0332009 | A1 | 11/2018 | Lange |
| 2019/0110754 | A1 | 4/2019 | Rao et al. |
| 2019/0134396 | A1 | 5/2019 | Toth et al. |
| 2019/0150774 | A1 | 5/2019 | Brinkmann et al. |
| 2019/0282817 | A1 | 9/2019 | Muller et al. |
| 2019/0333505 | A1 | 10/2019 | Stavisky et al. |

| | | | |
|---|---|---|---|
| 2020/0061374 | A1 | 2/2020 | Mitchell |
| 2020/0069427 | A1 | 3/2020 | Swennen et al. |
| 2020/0078586 | A1 | 3/2020 | Wijseundara et al. |
| 2020/0155828 | A1 | 5/2020 | Shepard et al. |
| 2020/0206503 | A1 | 7/2020 | Ganzer et al. |
| 2020/0215318 | A1 | 7/2020 | Fielder et al. |
| 2020/0222010 | A1 | 7/2020 | Howard |
| 2020/0310442 | A1 | 10/2020 | Halder et al. |
| 2020/0337579 | A1* | 10/2020 | Auerbach ........... A61B 5/6852 |
| 2020/0364539 | A1 | 11/2020 | Ansimov et al. |
| 2021/0033559 | A1 | 2/2021 | Panat et al. |
| 2021/0034906 | A1 | 2/2021 | Van Welzen et al. |
| 2021/0085988 | A1 | 3/2021 | Nin et al. |
| 2021/0186450 | A1 | 6/2021 | Vancamberg et al. |
| 2021/0213279 | A1 | 7/2021 | Rapoport et al. |
| 2021/0252289 | A1 | 8/2021 | Esteller |
| 2021/0267523 | A1 | 9/2021 | Donoghue et al. |
| 2021/0267526 | A1 | 9/2021 | Donoghue et al. |
| 2021/0268265 | A1 | 9/2021 | Eder et al. |
| 2021/0272687 | A1 | 9/2021 | Klopfenstein et al. |
| 2021/0275807 | A1 | 9/2021 | Bouton |
| 2021/0280309 | A1 | 9/2021 | Klopfenstein et al. |
| 2021/0353439 | A1 | 11/2021 | Norman et al. |
| 2022/0005465 | A1 | 1/2022 | Prabhavalkar et al. |
| 2022/0117511 | A1 | 4/2022 | Shor et al. |
| 2022/0175320 | A1 | 6/2022 | Shah et al. |
| 2022/0184403 | A1 | 6/2022 | Chouinard et al. |
| 2022/0208173 | A1 | 6/2022 | Chang et al. |
| 2022/0211312 | A1 | 7/2022 | Brinkmann et al. |
| 2022/0218264 | A1 | 7/2022 | Brunner et al. |
| 2022/0240833 | A1 | 8/2022 | Oxley |
| 2022/0301563 | A1 | 9/2022 | Chang et al. |
| 2022/0370805 | A1 | 11/2022 | Cogan et al. |
| 2022/0379117 | A1 | 12/2022 | Spector |
| 2022/0413612 | A1 | 12/2022 | Gribetz |
| 2023/0059718 | A1 | 2/2023 | Hor-Lao et al. |
| 2023/0062326 | A1 | 3/2023 | Colachis et al. |
| 2023/0111217 | A1 | 4/2023 | Weiss |
| 2023/0113727 | A1 | 4/2023 | Van Der Zalm et al. |
| 2023/0210427 | A1 | 7/2023 | Rapoport et al. |
| 2023/0253104 | A1 | 8/2023 | Serruya et al. |
| 2023/0271007 | A1 | 8/2023 | Ganzer et al. |
| 2023/0320417 | A1 | 10/2023 | Renner et al. |
| 2023/0389851 | A1 | 12/2023 | Tal et al. |
| 2023/0414947 | A1 | 12/2023 | Esteller |
| 2024/0029717 | A1 | 1/2024 | Jain et al. |
| 2024/0115178 | A1 | 4/2024 | Rapoport |
| 2024/0139512 | A1 | 5/2024 | Schulhauser et al. |
| 2024/0374893 | A1 | 11/2024 | Robinson et al. |
| 2024/0399152 | A1 | 12/2024 | Powell et al. |
| 2024/0412030 | A1 | 12/2024 | Guinn et al. |
| 2025/0010070 | A1 | 1/2025 | Ganzer et al. |

FOREIGN PATENT DOCUMENTS

| | | | |
|---|---|---|---|
| CN | 110876652 | A | 3/2020 |
| KR | 20200074951 | A | 6/2020 |
| WO | 2008052166 | A2 | 5/2008 |
| WO | 2012143850 | A1 | 10/2012 |
| WO | 2015191628 | A1 | 12/2015 |
| WO | 2015195553 | A1 | 12/2015 |
| WO | 2017160627 | A2 | 9/2017 |
| WO | 2017196971 | A1 | 11/2017 |
| WO | 2019079475 | A1 | 4/2019 |
| WO | 2019152648 | A1 | 8/2019 |
| WO | 2019211314 | A1 | 11/2019 |
| WO | 2020008016 | A1 | 1/2020 |
| WO | 2020008017 | A1 | 1/2020 |
| WO | 2020142384 | A1 | 7/2020 |
| WO | 2020219371 | A1 | 10/2020 |
| WO | 2021021714 | A1 | 2/2021 |
| WO | 2021055682 | A1 | 3/2021 |
| WO | 2021162795 | A1 | 8/2021 |
| WO | 2021174061 | A1 | 9/2021 |
| WO | 2022011260 | A1 | 1/2022 |
| WO | 2022126059 | A1 | 6/2022 |

(56)            References Cited

FOREIGN PATENT DOCUMENTS

WO          2022251151 A1    12/2022
WO          2024254360 A1    12/2024

OTHER PUBLICATIONS

Anumanchipalli G.K., et al., "Speech Synthesis from Neural Decoding of Spoken Sentences," Nature, Apr. 2019, vol. 568, No. 7753, pp. 493-498.
Collobert R., et al., "A Fully Differentiable Beam Search Decoder," A preprint, Feb. 19, 2019, 11 pages.
Defossez A., et al., "Decoding Speech Perception from Noninvasive Brain Recordings," Nature Machine Intelligence, Oct. 5, 2023, vol. 5, pp. 1097-1107.
Duraivel S., et al., "High-resolution Neural Recordings Improve the Accuracy of Speech Decoding," Nature Communications, Nov. 6, 2023, vol. 14, No. 6938, 16 pages.
Haufe S., et al., "Elucidating Relations Between Fmri, Ecog and Eeg Through a Common Natural Stimulus," Publication bioR/iv. Oct. 22, 2017.
Inclusive Technology., "Inclusive Eyegaze Education with Mygaze Eye Tracker—Discontinued," Spectronics, Feb. 25, 2025, 8 pages, Retrieved from the Internet: URL: https://www.spectronics.com.au/product/inclusive-eyegaze-education-with-mygaze-eye-tracker#mygaze.
International Preliminary Report on Patentability for the Application No. PCT/US2023/035620, mailed May 1, 2025, 9 pages.
International Preliminary Report on Patentability for the Application No. PCT/US2023/035623, mailed May 1, 2025, 9 pages.
International Preliminary Report on Patentability for the Application No. PCT/US2023/035624, mailed May 1, 2025, 9 pages.
International Preliminary Report on Patentability for the Application No. PCT/US2023/035625, mailed May 1, 2025, 7 pages.
International Preliminary Report on Patentability for the Application No. PCT/US2023/035627, mailed May 1, 2025, 8 pages.
International Search Report and Written Opinion for Application No. PCT/US2025/011619, mailed on Mar. 27, 2025, 13 Pages.
Meta., "AI Speech Research Voicebox: Text-guided Multilingual Universal Speech Generation at Scale," Voicebox, Research by Meta AI, 2023, 8 pages, Retrieved on Feb. 25, 2025, Retrieved from the Internet: URL: https://voicebox.metademolab.com/.
International Preliminary Report on Patentability issued in International Application No. PCT/US2023/035620, 9 pages, dated May 1, 2025.
Chen et al., "Emerging Brain-to-Content Technologies From Generative AI and Deep Representation Learning (In the Spotlight)", IEEE Signal Processing Magazine, vol. 41, No. 6, pp. 94-104, Nov. 2024.
International Search Report and Written Opinion of the International Searching Authority issued in International Application No. PCT/US2023/035624, 15 pages, dated Feb. 26, 2024.
International Search Report and Written Opinion of the International Searching Authority issued in International Application No. PCT/US2022/082619, 16 pages, dated Jun. 2, 2023.
International Search Report and Written Opinion of the International Searching Authority issued in International Application No. PCT/US2023/035627, 13 pages, dated Feb. 9, 2024.
International Search Report and Written Opinion of the International Searching Authority issued in International Application No. PCT/US2023/035625, 13 pages, dated Feb. 26, 2024.
International Search Report and Written Opinion of the International Searching Authority issued in International Application No. PCT/US2023/035620, 14 pages, dated Feb. 15, 2024.
International Search Report and Written Opinion of the International Searching Authority issued in International Application No. PCT/US2022/078130, 11 pages, dated Feb. 16, 2023.
International Search Report and Written Opinion of the International Searching Authority issued in International Application No. PCT/US2023/063894, 14 pages, dated Sep. 29, 2023.
International Search Report and Written Opinion of the International Searching Authority issued in International Application No. PCT/US2023/035623, 10 pages, dated Feb. 8, 2024.
Camara et al., "Security and Privacy Issues in Implantable Medical Devices: A Comprehensive Survey", Journal of Biomedical Informatics, vol. 55, 45 pages, Jun. 11, 2015.
Hettick et al., "The Layer 7 Cortical Interface: A Scalable and Minimally Invasive Brain-Computer Interface Program". bioRxiv, 42 pages, Jan. 30, 2024.
Liu et al., "An Energy-Efficient Compressed Sensing-Based Encryption Scheme for Wireless Neural Recording," IEEE Journal on Emerging Topic in Circuits and Systems, 10 pages, Jun. 2021.
Wang et al., "Unsupervised Decoding of Long-Term, Naturalistic Human Neural Recordings with Automated Video and Audio Annotations", frontiers in Human Neuroscience, vol. 10, Article 165, 13 pages, Apr. 21, 2016.
Sorrell et al., "Brain-Machine Interfaces: Closed-Loop Control in an Adaptive System", Annual Review of Control, Robotics, and Autonomous Systems, vol. 4, pp. 167-189, Jan. 29, 2021.
International Search Report and Written Opinion of the International Searching Authority issued in International Application No. PCT/US2023/077626, 12 pages, dated Feb. 28, 2024.
International Preliminary Report on Patentability for Application No. PCT/US2022/78130, mailed on Apr. 25, 2024, 8 Pages.
International Preliminary Report on Patentability for the Application No. PCT/US2022/82619, mailed Jul. 11, 2024, 9 pages.
International Preliminary Report on Patentability for the Application No. PCT/US2023/063894, mailed Sep. 19, 2024, 12 pages.
International Search Report and Written Opinion for Application No. PCT/US2024/017647, mailed on Jun. 6, 2024, 13 pages.
International Search Report and Written Opinion for Application No. PCT/US2024/028423, mailed on Jul. 18, 2024, 13 pages.
Kim T., et al., "Spatiotemporal Compression for Efficient Storage and Transmission of High-Resolution Electrocorticography Data," Annual International Conference of the IEEE Engineering in Medicine and Biology Society, Aug. 28, 2012, pp. 1012-1015.
Office Action for Canadian Patent Application No. 3241544, mailed Jul. 25, 2024, 3 pages.
International Search Report and Written Opinion of the International Searching Authority issued in International Application No. PCT/US2024/043449, 16 pages, dated Nov. 15, 2024.
Biederman W., et al., "A Fully-Integrated, Miniaturized (0.125 mm$^2$) 10.5 μW Wireless Neural Sensor," IEEE Journal of Solid-state Circuits, 2013, vol. 48, No. 4, pp. 960-970.
Coelho K., et al., "Cryptographic Algorithms in Wearable Communications: An Empirical Analysis," IEEE Communications Letters, 2019, vol. 23, No. 11, pp. 1931-1934.
Examination Report No. 1 for Australian Patent Application No. 2023230897 dated Jun. 26, 2025, 10 pages.
Ghoreishizadeh S.S., et al., "A Lightweight Cryptographic System for Implantable Biosensors," Proceedings of 2014 IEEE Biomedical Circuits and Systems Conference (BioCAS), 2014, pp. 472-475.
Hinterberger T., et al., "Voluntary Brain Regulation and Communication with Electrocorticogram Signals," Epilepsy and Behavior, Aug. 1, 2008, vol. 13, No. 2, pp. 300-306.
International Search Report and Written Opinion for Application No. PCT/US2025/019165, mailed on Jun. 6, 2025, 18 pages.
Kim H., et al., "A Configurable and Low-Power Mixed Signal SoC for Portable ECG Monitoring Applications," IEEE Transactions on Biomedical Circuits and Systems, 2014, vol. 8, No. 2, pp. 257-267.
Schwemmer M.A., et al., "Meeting Brain-Computer Interface User Performance Expectations Using a Deep Neural Network Decoding Framework," Nature Medicine, Sep. 24, 2018, vol. 24, No. 11, pp. 1669-1676.
Yanagisawa T., et al., "Electrocorticographic Control of a Prosthetic Arm in Paralyzed Patients," Annals of Neurology, 2012, vol. 71, No. 3, pp. 353-361.
Escabi M.A., et al., "A high-density, high-channel count, multi-plexed muECOG array for auditory-cortex recordings" Journal of Neurophysiology, 2014, vol. 112, No. 6, pp. 1566-1583.
Office Action for Canadian Patent Application No. 3,245,576, mailed Oct. 14, 2025, 5 pages.

(56)                References Cited

OTHER PUBLICATIONS

Rohaut B., et al., "Uncovering Consciousness in Unresponsive ICU Patients: Technical, Medical and Ethical Considerations," Critical Care, Mar. 9, 2019, vol. 23, No. 78, 9 pages, doi: 10.1186/s13054-019-2370-4.

"What are polymides?", UBE Corporation, accessed on Sep. 19, 2025, accessed at https://www.ube.com/ube/en/contents/chemical/ploymide/ploymide_column.html (Year: 2025).

Beck C., et al., "Block Cipher Based Security for Severely Resource-Constrained Implantable Medical Devices," In Proceedings of the 4th International Symposium on Applied Sciences in Biomedical and Communication Technologies (Isabel '11) Association for Computing Machinery, Oct. 26, 2011, No. 62, pp. 1-5.

Bridges D.C., et al., "MEA Viewer: A High-performance Interactive Application for Visualizing Electrophysiological Data," PLoS One, Feb. 9, 2018, vol. 12, No. 2, 10 pages.

Daemen J., et al., "AES Proposal: Rijndael," National Institute of Standards and Technology, 1999, 47 pages.

Judy M., et al., "A Nonlinear Signal-Specific ADC for Efficient Neural Recording," Biomedical Circuits and Systems Conference (BioCAS), 2010, pp. 17-20.

Kester Q.A., "A Cryptographic Image Encryption Technique for Facial-Blurring of Images," International Journal of Advanced Technology & Engineering Research, May 2013, vol. 3, No. 3, pp. 1-7.

Maji S., et al., "A Low-power Dual-Factor Authentication Unit for Secure Implantable Devices" IEEE Custom Integrated Circuits Conference (CICC), 2020, 10 pages, Retrieved from the Internet URL: https://arxiv.org/pdf/2004.13709.

Matsushita K., et al., "A Fully Implantable Wireless ECoG 128-Channel Recording Device for Human Brain-machine Interfaces: W-HERBS," Frontiers in Neuroscience, Jul. 30, 2018, vol. 12, No. 511, 11 pages.

Ogawa H., et al., "Rapid and Minimum Invasive Functional Brain Mapping by Real-time Visualization of High Gamma Activity During Awake Craniotomy," World Neurosurgery, Nov. 2014, 10 pages.

Pallud J., et al., Direct Electrical Bipolar Electrostimulation for Functional Cortical and Subcortical Cerebral Mapping in Awake Craniotomy. Practical Considerations, Neurochirurgie, Jun. 1, 2017, vol. 63, pp. 164-174.

Schneier B., "Description of a New Variable-Length Key, 64-Bit Block Cipher (Blowfish)," Fast Software Encryption, Cambridge Security Workshop Proceedings, Dec. 1993, pp. 191-204.

Tchoe Y., et al., "Human Brain Mapping with Multi-thousand Channel PtNRGrids Resolves Spatiotemporal Dynamics," Science Translational Medicine, Jan. 19, 2022, vol. 14, No. 628, 22 pages.

Third Party Prior Art Submission for U.S. Appl. No. 18/180,248, filed Aug. 12, 2025.

Thorpe C., et al., "A Coprime Blur Scheme for Data Security in Video Surveillance," In IEEE Transactions on Pattern Analysis and Machine Intelligence, 2013, vol. 35, No. 12, pp. 3066-3072.

Uy J., et al., "Stability of Maps of Human Motor Cortex Made with Transcranial Magnetic Stimulation," Brain Topography, Jun. 2002, vol. 14, No. 4, pp. 293-297.

* cited by examiner

Figure 5A:
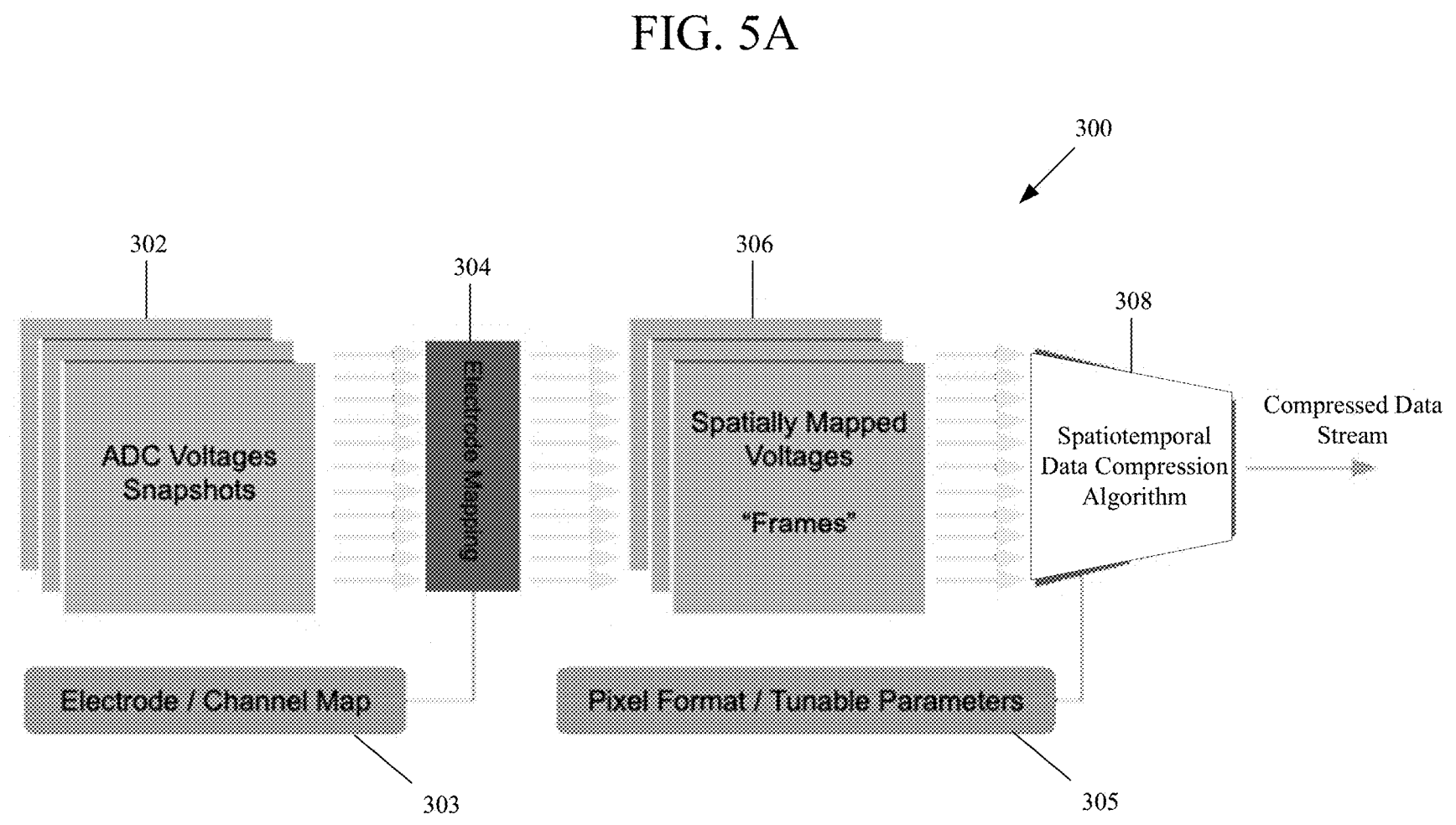

302 ADC Voltages Snapshots

303 Electrode / Channel Map

304 Electrode Mapping

306 Spatially Mapped Voltages "Frames"

305 Pixel Format / Tunable Parameters

308 Spatiotemporal Data Compression Algorithm

Compressed Data Stream

FIG. 7A

| | 0 | 1 | 2 | 3 | 4 | 5 | 6 | 7 | Null |
|---|---|---|---|---|---|---|---|---|---|
| 0 | 77 | 0 | 0 | 0 | 0 | 0 | 1 | 0 | 53 |
| 1 | 0 | 125 | 1 | 0 | 0 | 0 | 0 | 0 | 8 |
| 2 | 0 | 1 | 122 | 0 | 0 | 0 | 0 | 0 | 9 |
| 3 | 0 | 0 | 4 | 81 | 5 | 4 | 2 | 0 | 36 |
| 4 | 0 | 0 | 0 | 4 | 94 | 4 | 1 | 0 | 28 |
| 5 | 0 | 0 | 0 | 0 | 7 | 92 | 1 | 0 | 32 |
| 6 | 0 | 0 | 0 | 1 | 0 | 0 | 117 | 1 | 13 |
| 7 | 0 | 0 | 0 | 0 | 0 | 1 | 2 | 120 | 10 |

FIG. 7B

|   | 0 | 1 | 2 | 3 | 4 | 5 | 6 | 7 | Null |
|---|---|---|---|---|---|---|---|---|------|
| 0 | 90 | 0 | 0 | 0 | 0 | 0 | 0 | 0 | 40 |
| 1 | 0 | 130 | 1 | 0 | 0 | 0 | 0 | 0 | 5 |
| 2 | 0 | 0 | 125 | 1 | 0 | 0 | 0 | 0 | 5 |
| 3 | 0 | 0 | 2 | 110 | 4 | 2 | 0 | 0 | 15 |
| 4 | 0 | 0 | 0 | 2 | 116 | 4 | 0 | 0 | 9 |
| 5 | 0 | 0 | 0 | 0 | 5 | 112 | 0 | 0 | 15 |
| 6 | 0 | 0 | 0 | 0 | 0 | 0 | 122 | 0 | 9 |
| 7 | 0 | 0 | 0 | 0 | 1 | 0 | 1 | 126 | 5 |

FIG. 7C

|     | 0  | 1   | 2   | 3   | 4   | 5   | 6   | 7   | Null |
| --- | -- | --- | --- | --- | --- | --- | --- | --- | ---- |
| 0   | 75 | 0   | 0   | 0   | 0   | 0   | 0   | 0   | 55   |
| 1   | 0  | 130 | 0   | 0   | 0   | 0   | 0   | 1   | 4    |
| 2   | 0  | 1   | 125 | 1   | 0   | 0   | 0   | 1   | 5    |
| 3   | 0  | 0   | 2   | 100 | 10  | 4   | 1   | 0   | 16   |
| 4   | 0  | 0   | 0   | 2   | 112 | 9   | 0   | 0   | 8    |
| 5   | 0  | 0   | 0   | 1   | 6   | 114 | 1   | 0   | 9    |
| 6   | 0  | 0   | 0   | 1   | 0   | 0   | 121 | 2   | 8    |
| 7   | 0  | 1   | 0   | 0   | 0   | 1   | 1   | 127 | 3    |

DATA COMPRESSION FOR NEURAL SYSTEMS

PRIORITY

The present application claims priority to U.S. Provisional Patent Application No. 63/487,394, titled DATA COMPRESSION FOR NEURAL SYSTEMS, filed Feb. 28, 2023, which is hereby incorporated by reference herein in its entirety.

BACKGROUND

Brain-computer interfaces have shown promise as systems for restoring, replacing, and augmenting lost or impaired neurological function in a variety of contexts, including paralysis from stroke and spinal cord injury, blindness, and some forms of cognitive impairment. Multiple innovations over the past several decades have contributed to the potential of these neural interfaces, including advances in the areas of applied neuroscience and multi-channel electrophysiology, mathematical and computational approaches to neural decoding, power-efficient custom electronics and the development of application-specific integrated circuits, as well as materials science and device packaging. Nevertheless, the practical impact of such systems remains limited, with only a small number of patients worldwide having received highly customized interfaces through clinical trials.

High bandwidth brain-computer interfaces are being developed to enable the bidirectional communication between the nervous system and external computer systems in order to assist, augment, or replace neurological function lost to disease or injury. A necessary capability of any brain-computer interface is the ability to accurately decode electrophysiologic signals recorded from individual neurons, or populations of neurons, and correlate such activity with one or more sensory stimuli or intended motor response. For example, such a system may record activity from the primary motor cortex in an animal or a paralyzed human patient and attempt to predict the actual or intended movement in a specific body part; or the system may record activity from the visual cortex and attempt to predict both the location and nature of the stimuli present in the patient's visual field.

Furthermore, brain-penetrating microelectrode arrays have facilitated high-spatial-resolution recordings for brain-computer interfaces, but at the cost of invasiveness and tissue damage that scale with the number of implanted electrodes. In some applications, softer electrodes have been used in brain-penetrating microelectrode arrays; however, it is not yet clear whether such approaches offer a substantially different tradeoff as compared to conventional brain-penetrating electrodes. For this reason, non-penetrating cortical surface microelectrodes represent a potentially attractive alternative and form the basis of the system described here. In practice, electrocorticography (ECoG) has already facilitated capture of high quality signals for effective use in brain-computer interfaces in several applications, including motor and speech neural prostheses. Higher-spatial-resolution micro-electrocorticography (μECoG) therefore represents a promising combination of minimal invasiveness and improved signal quality. Therefore, it would be highly beneficial for neural devices to make use of non-penetrating cortical interfaces.

It is generally desirable for brain-computer interfaces to be high-bandwidth in order to capture as much electrophysiologic data as possible in order to aid in neural decoding and/or control applications. As can be envisioned, such high-bandwidth brain-computer interfaces generate substantial amounts of data that often needed to be communicated off-device for further processing and/or to control an external device. Current wireless communication protocols are generally incapable of efficiently transmitting electrophysiologic data in a substantially lossless manner because the rate at which data is generated by such high bandwidth brain-computer interfaces far exceeds the data bandwidth of existing wireless communication protocols. Current neural recording and/or control systems generally solve the data transmission bottleneck by throttling the amount of data that is transmitted (e.g., utilizing neural devices having fewer channels or undersampling the electrophysiologic data) or utilizing wired connections. However, none of these techniques truly provide a desirable solution to the problem because they require that the individual in which the brain-computer interface is implanted either be tethered to the external device via a wired connection or substantially impact the fidelity (and, thus, the usability) of the data. Therefore, it would be highly desirable to make use of data compression algorithms in order to facilitate the wireless transmittal of the electrophysiologic data. However, currently existing lossless data compression algorithms are not able to compress electrophysiologic data to a sufficient degree to permit wireless transmittal. Further, currently existing lossy data compression algorithms negatively impact the fidelity of the electrophysiologic data to an undesirable degree. Therefore, techniques for compressing electrophysiologic data captured by high bandwidth brain-computer interfaces such to facilitate its wireless transmittal of the data in a substantially lossless manner would be highly desirable. However, the techniques described herein are also useful for wired implementations in order to reduce the size of captured neural data to save local or cloud storage space.

SUMMARY

The present disclosure is directed to systems and methods for compressing data for neural devices comprising brain-computer interfaces and related medical devices.

In some embodiments, there is provided an implantable neural device comprising: an electrode array, wherein the electrode array comprises a plurality of electrodes arranged in a uniform configuration; and a controller programmed to: receive electrophysiologic signal data from the electrode array, map the electrophysiologic signal data to locations of each of the plurality of the electrodes, compress the mapped electrophysiologic signal data based on the locations of the plurality of electrodes utilizing a spatiotemporal data compression algorithm to define compressed electrophysiologic signal data, and transmit the compressed electrophysiologic signal data to an external device.

In some embodiments, there is provided a system comprising: an implantable neural device comprising: an electrode array, wherein the electrode array comprises a plurality of electrodes arranged in a uniform configuration, and a controller programmed to: receive electrophysiologic signal data from the electrode array, map the electrophysiologic signal data to locations of each of the plurality of the electrodes, compress the mapped electrophysiologic signal data based on the locations of the plurality of electrodes utilizing a spatiotemporal data compression algorithm to define compressed electrophysiologic signal data, and transmit the compressed electrophysiologic signal data; a computer system communicably coupled to the implantable neural device, the computer system comprising a memory and a processor, the memory storing instructions that, when executed by the processor, cause the computer system to: receive the compressed electrophysiologic data from the neural device, decompress the electrophysiologic data, and provide the decompressed electrophysiologic data to a user or another program.

In one embodiment of the implantable neural device and/or system, the spatiotemporal data compression algorithm is selected from the group consisting of H.264, H.265, AV1, and VC-1.

In one embodiment of the implantable neural device and/or system, the controller is further programmed to: tile multiple frames of the electrophysiologic signal data based on spatial locations of electrode channels corresponding to the electrode array to define a macro frame; and compress the macro frame data based on the locations of the plurality of electrodes utilizing the spatiotemporal data compression algorithm to define compressed electrophysiologic signal data.

In one embodiment of the implantable neural device and/or system, the plurality of electrodes comprise non-penetrating electrodes.

In one embodiment of the implantable neural device and/or system, the plurality of electrodes are arranged in a grid.

In one embodiment of the implantable neural device and/or system, the controller is further programmed to represent the electrophysiologic data in greyscale prior for compression.

In one embodiment of the implantable neural device and/or system, the controller is further programmed to represent the electrophysiologic data in color prior for compression.

FIGURES

FIG. 5A depicts a diagram of a data compression pipeline for a neural device, in accordance with an embodiment of the present disclosure.

FIG. 7A depicts a confusion matrix for the neural decoding model trained using uncompressed, raw electrophysiologic data, in accordance with an embodiment of the present disclosure.

FIG. 7B depicts a confusion matrix for the neural decoding model trained using the same electrophysiologic data as in FIG. 7A that was compressed using a spatiotemporal compression algorithm with moderately aggressive compression, in accordance with an embodiment of the present disclosure.

FIG. 7C depicts a confusion matrix for the neural decoding model trained using the same electrophysiologic data as in FIG. 7A that was compressed using a spatiotemporal compression algorithm with highly aggressive compression, in accordance with an embodiment of the present disclosure.

DETAILED DESCRIPTION

The present disclosure is generally directed to systems and methods for automatic calibration of mathematical models used to perform neural decoding in high-bandwidth neural interfaces. The system consists of a high-density neural interface in direct contact with the cortical or deep brain surfaces along with one or more time-synced sensors recording motor, sensory, visual, or auditory feedback from the user's body or local environment. After an initial calibration phase involving the active input of the user and training of one or more neural decoding algorithms, the system uses transfer learning techniques to create user-specific neural decoding algorithms based on global data-sets, thereby minimizing the amount of training for the neural decoding algorithms that needs to be performed for each individual user.

Neural Device Systems

Figure 1:
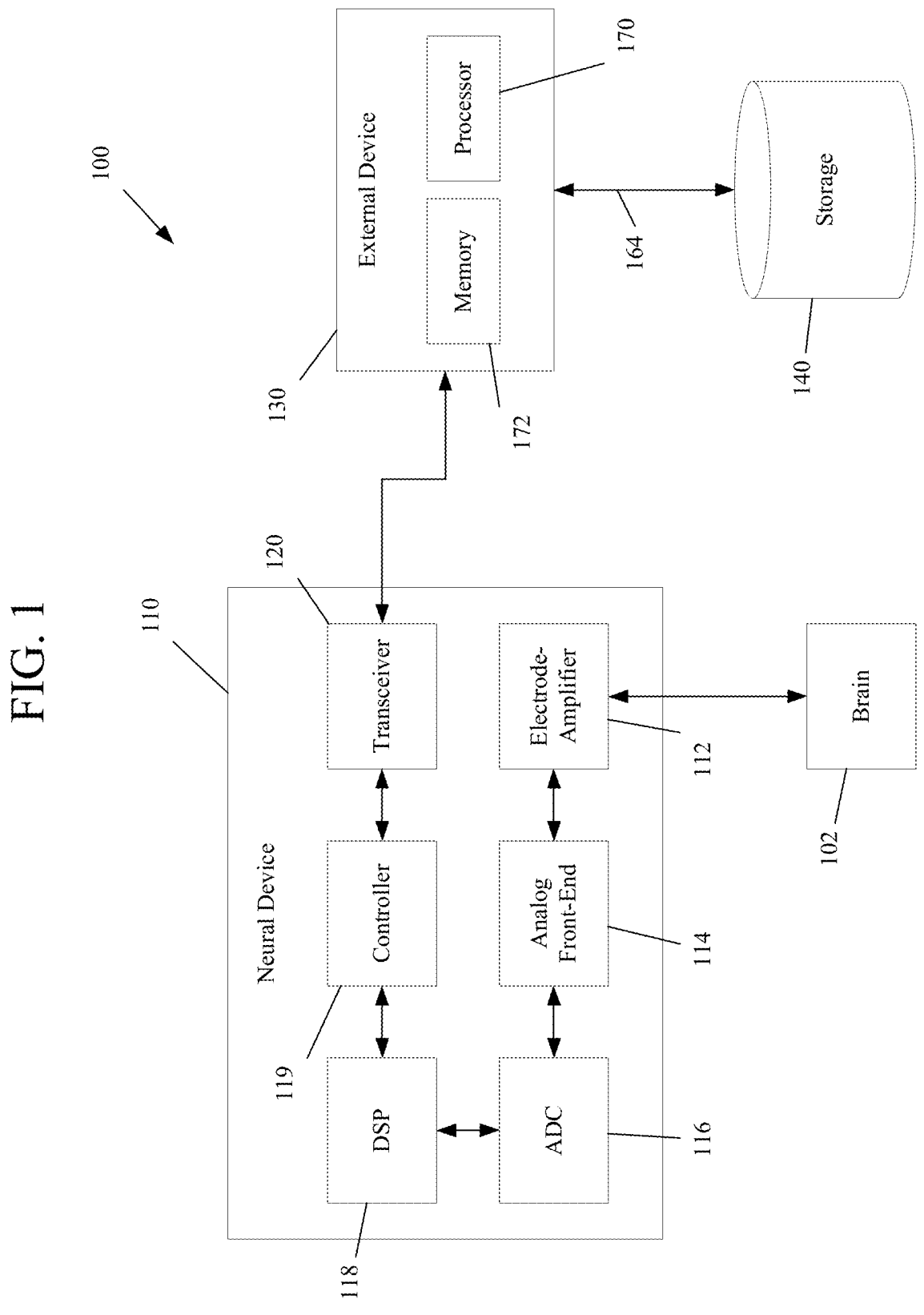
FIG. 1 depicts a block diagram of a secure neural device data transfer system, in accordance with an embodiment of the present disclosure.

Conventional neural devices typically include electrode arrays that penetrate a subject's brain in order to sense and/or stimulate the brain. However, the present disclosure is directed to the use of non-penetrating neural devices, i.e., neural devices having electrode arrays that do not penetrate the cortical surface. Such non-penetrating neural devices are minimally invasive and minimize the amount of impact on the subject's cortical tissue. Neural devices can sense and record brain activity, receive instructions for stimulating the subject's brain, and otherwise interact with a subject's brain as generally described herein. Referring now to FIG. 1, there is shown a diagram of an illustrative system 100 including a neural device 110 that is communicatively coupled to an external device 130. The external device 130 can include any device that the neural device 110 can be communicatively coupled, such as a computer system or mobile device (e.g., a tablet, a smartphone, a laptop, a desktop, a secure server, a smartwatch, a head-mounted virtual reality device, a head-mounted augmented reality device, or a smart inductive charger device). The external device 130 can include a processor 170 and a memory 172. In some embodiments, the computer system 102 can include a server or a cloud-based computing system. In some embodiments, the external device 130 can further include or be communicatively coupled to storage 140. In one embodiment, the storage 140 can include a database stored on the external device 130. In another embodiment, the storage 140 can include a cloud computing system (e.g., Amazon Web Services or Azure).

The neural device 110 can include a range of electrical or electronic components. In the illustrated embodiment, the neural device 110 includes an electrode-amplifier stage 112, an analog front-end stage 114, an analog-to-digital converter (ADC) stage 116, a digital signal processing (DSP) stage 118, and a transceiver stage 120 that are communicatively coupled together. The electrode-amplifier stage 112 can include an electrode array, such as is described below, that is able to physically interface with the brain 102 of the subject in order to sense brain signals and/or apply electrical signals thereto. The analog front-end stage 114 can be configured, amplify signals that are sensed from or applied to the brain 102, perform conditioning of the sensed or applied analog signals, perform analog filtering, and so on. The front-end stage 114 can include, for example, one or more application-specific integrated circuits (ASICs) or other electronics. The ADC stage 116 can be configured to convert received analog signals to digital signals and/or convert received digital signals to an analog signal to be processed via the analog front-end stage 114 and then applied via the electrode-amplifier stage 112. The DSP stage 118 can be configured to perform various DSP techniques, including multiplexing of digital signals received via the electrode-amplifier stage 112 and/or from the external device 130. For example, the DSP stage 118 can be configured to convert instructions from the external device 130 to a corresponding digital signal. The transceiver stage 120 can be configured to transfer data from the neural device 110 to the external device 130 located outside of the body of the subject 102.

In some embodiments, the neural device 110 can further include a controller 119 that is configured to perform various functions, including compressing electrophysiologic data generated by the electrode array 180. In various embodiments, the controller 119 can include hardware, software, firmware, or various combinations thereof that are operable to execute the functions described below. In one embodiment, the controller 119 can include a processor (e.g., a microprocessor) executing instructions stored in a memory. In another embodiment, the controller 119 can include a field-programmable gate array (FPGA) or application-specific integrated circuit (ASIC).

In various embodiments, the stages of the neural device 110 can provide unidirectional or bidirectional communications (as indicated in FIG. 1) by and between the neural device 110 and the external device 130. In various embodiments, one or more of the stages can operate in a serial or parallel manner with other stages of the system 100. It can further be noted that the depicted architecture for the system 100 is simply intended for illustrative purposes and that the system 100 can be arranged differently (i.e., components or stages can be connected in different manners) or include additional components or stages.

Figure 2:
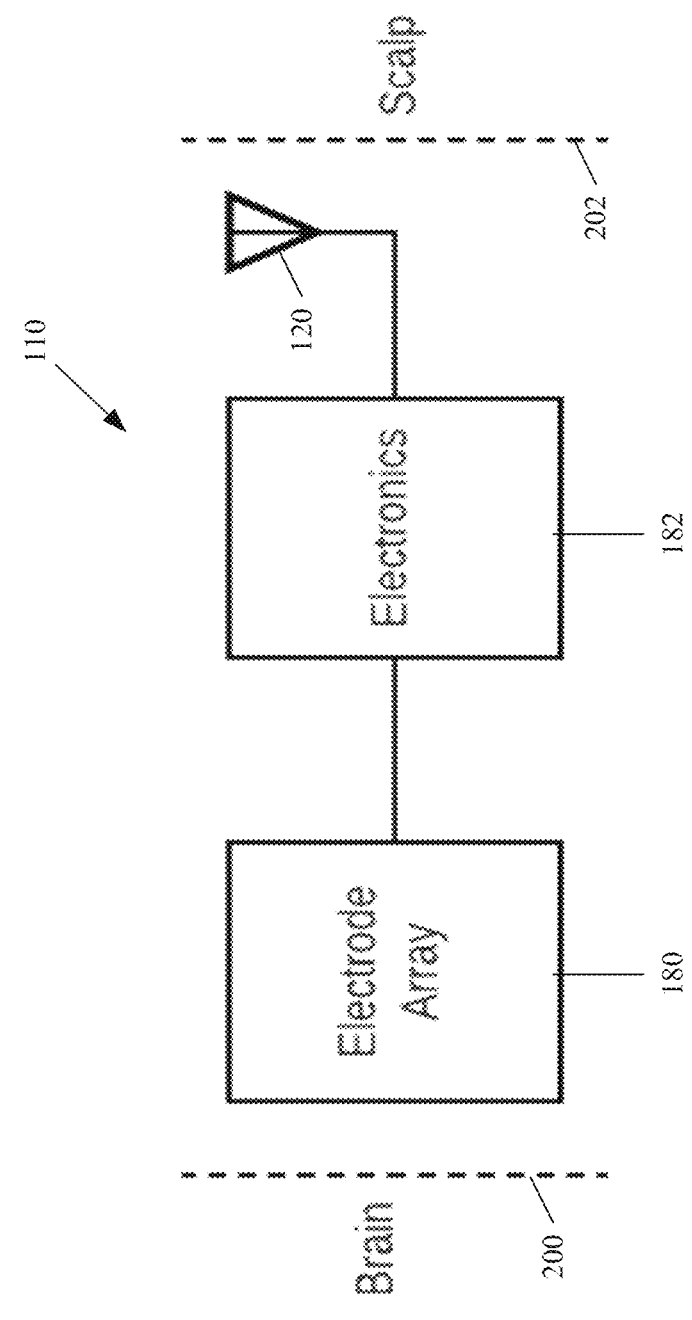
FIG. 2 depicts a diagram of a neural device, in accordance with an embodiment of the present disclosure.

In some embodiments, the neural device 110 described above can include a brain implant, such as is shown in FIG. 2. The neural device 110 may be a biomedical device configured to study, investigate, diagnose, treat, and/or augment brain activity. In some embodiments, the neural device 110 may be positioned between the brain 200 and the scalp 202. The neural device 110 can include an electrode array 180 (which may be a component of or coupled to the electrode-amplifier stage 112 described above) that is configured to record and/or stimulate an area of the brain 200.

The electrode array 180 can be connected to an electronics hub 182 (which can include one or more of the electrode-amplifier stage 112, analog front-end stage 114, ADC stage 116, and DSP stage 118) that is configured to transmit via wireless or wired transceiver 120 to the external device 130 (in some cases, referred to as a "receiver").

The electrode array 180 can include non-penetrating cortical surface microelectrodes (i.e., the electrode array 180 does not penetrate the brain 200). Accordingly, the neural device 110 can provide a high spatial resolution, with minimal invasiveness and improved signal quality. The minimal invasiveness of the electrode array 180 is beneficial because it allows the neural device 110 to be used with larger population of patients than conventional brain implants, thereby expanding the application of the neural device 110 and allowing more individuals to benefit from brain-computer interface technologies. Furthermore, the surgical procedures for implanting the neural devices 110 are minimally invasive, reversible, and avoid damaging neural tissue. In some embodiments, the electrode array 180 can be a high-density microelectrode array that provides smaller features and improved spatial resolution relative to conventional neural implants.

In some embodiments, the neural device 110 includes an electrode array configured to stimulate or record from neural tissue adjacent to the electrode array, and an integrated circuit in electrical communication with the electrode array, the integrated circuit having an analog-to-digital converter (ADC) producing digitized electrical signal output. In some embodiments, the ADC or other electronic components of the neural device 110 can include an encryption module, such as is described below. The neural device 110 can also include a wireless transmitter (e.g., the transceiver 120) communicatively coupled to the integrated circuit or the encryption module and an external device 130. The neural device 110 can also include, for example, control logic for operating the integrated circuit or electrode array 180, memory for storing recordings from the electrode array, and a power management unit for providing power to the integrated circuit or electrode array 180.

Figure 3A:
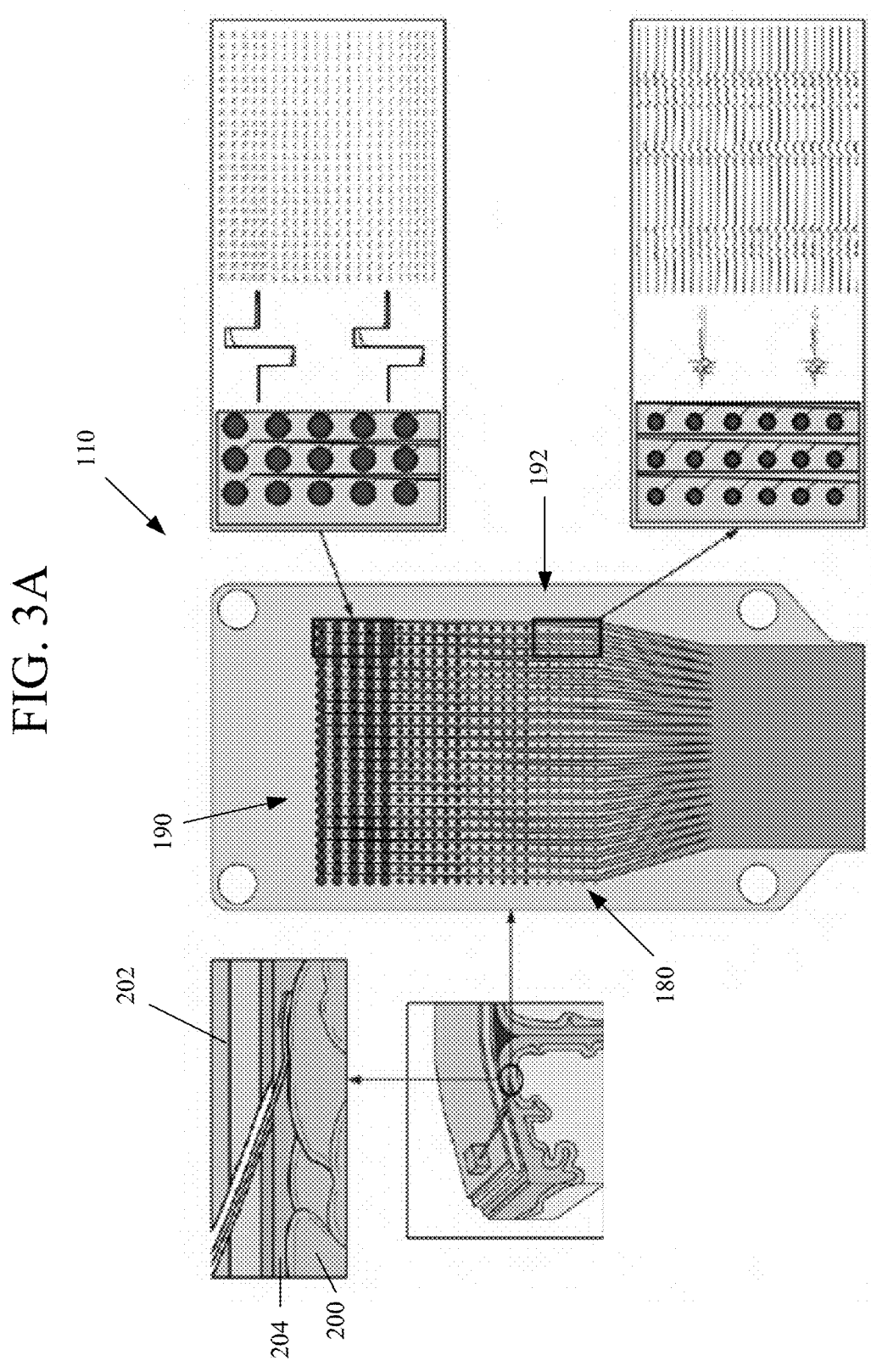
FIG. 3A depicts a diagram of a thin-film, microelectrode array neural device and implantation method, in accordance with an embodiment of the present disclosure.
Figure 3B:
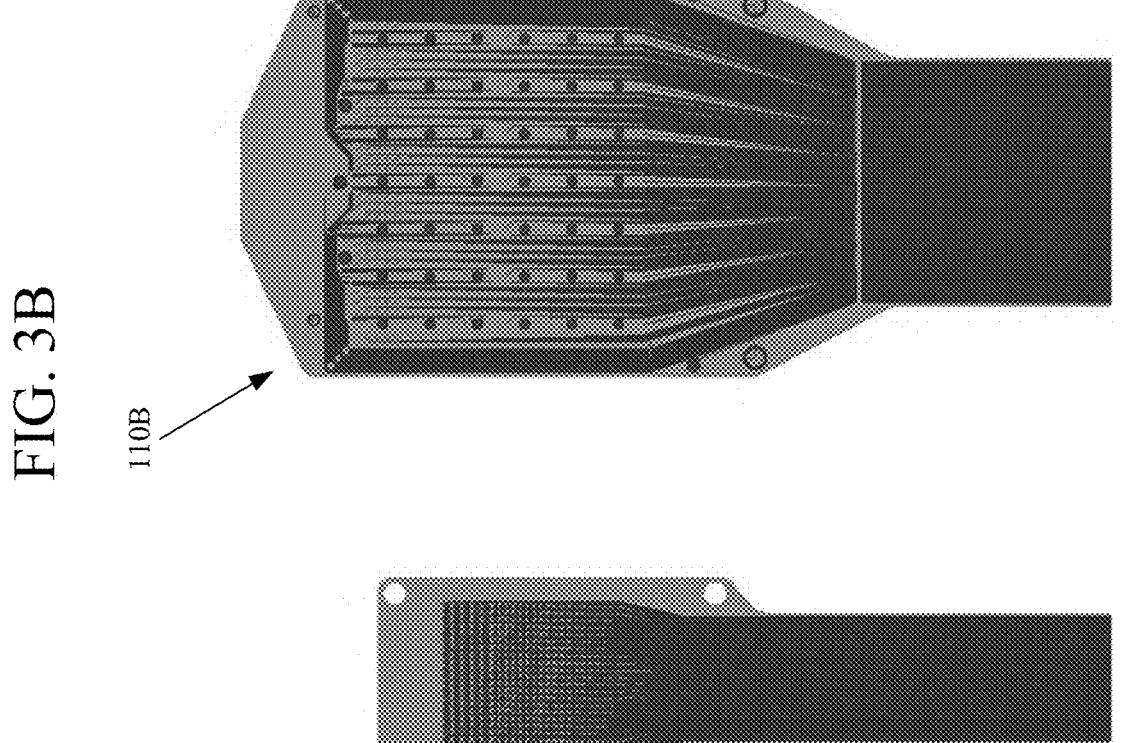
FIG. 3B depicts alternative embodiments of a neural device having 512 and 1,024 channels.

Referring now to FIG. 3A, there is shown a diagram of an illustrative embodiment of a neural device 110. In this embodiment, the neural device 110 includes an electrode array 180 including non-penetrating microelectrodes. As generally described above, the neural device 110 can be configured for minimally invasive subdural implantation using a cranial micro-slit technique, i.e., is inserted into the subdural space 204 between a patient's scalp 202 and brain 200. Further, the microelectrodes of the electrode array 180 can be arranged in a variety of different configurations and may vary in size. In this particular example, the electrode array 180 includes a first group 190 of electrodes (e.g., 200 μm microelectrodes) and a second group 192 of electrodes (e.g., 20 μm microelectrodes). Further, example stimulation waveforms in connection with the first group 190 of electrodes and the resulting post-stimulus activity recorded over the entire array is depicted for illustrative purposes. Still further, example traces from recorded neural activity recorded by the second group 192 of electrodes are likewise illustrated. In this example, the electrode array 180 provides multichannel data that can be used in a variety of electrophysiologic paradigms to perform neural recording of both spontaneous and stimulus-evoked neural activity as well as decoding and focal stimulation of neural activity across a variety of functional brain regions. The electrode array 180 can include different numbers of electrodes (i.e., channels) or have the electrodes arranged or otherwise disposed in different configurations. For example, FIG. 3A depicts an embodiment of the neural device 110 having a 512-channel electrode array 180. As another example, FIG. 3B depicts an embodiment of the neural device 110 having a 1,024-channel electrode array 180.

Additional information regarding brain-computer interfaces described herein can be found in Ho et al, *The Layer 7 Cortical Interface: A Scalable and Minimally Invasive Brain-Computer Interface Platform*, bioRxiv 2022.01.02.474656; doi: https://doi.org/10.1101/2022.01.02.474656, which is hereby incorporated by reference herein in its entirety.

Data Compression for Neural Devices

As generally noted above, one issue facing implantable neural device systems, such as the system 100 described above in connection with FIG. 1, is transmitting the significant amount of data that is generated by the neural devices 110 to an external device 130 for further processing or analysis thereon, to control the external device 130, and so on. Current wireless communication protocols are generally incapable of efficiently transmitting electrophysiologic data in a substantially lossless manner because the rate at which data is generated by such neural devices 110 far exceeds the data bandwidth of existing wireless communication protocols. Current neural recording and/or control systems generally solve the data transmission bottleneck by throttling the amount of data that is transmitted (e.g., utilizing neural devices having fewer channels or undersampling the electrophysiologic data) or utilizing wired connections. However, each of these approaches has their own issues. For example, requiring a wired connection means that the individual in which the neural device 110 is implanted would be forced to be tethered to an external device 130 via the wired connection. As another example, utilizing fewer electrode channels or undersampling the data results in less data fidelity, which in turn negatively impacts the ability to properly interpret the received electrophysiologic data. Therefore, it would be highly beneficial for neural device systems 100 to employ efficient, substantially lossless data compression techniques to facilitate the transmittal of the captured electrophysiologic data. However, such efficient, substantially lossless data compression techniques are also beneficial for neural device systems 100 utilizing wired connections in order to limit local or cloud-based storage requirements, thereby allowing the neural device systems 100 to avoid requiring onerous cloud-based data communication requirements and/or significant local data storage hardware.

As described above, the neural device 110 includes an array 180 of non-penetrating microelectrodes that are arranged in a spatially repeated manner. Each electrode is adapted to sense a voltage signal corresponding to the location of the subject's brain 102 that is in contact with the electrode. Accordingly, the electrode array 180 can sense voltage signals across the surface of the subject's brain 102 that is in contact with the electrode array 180. Highly dense electrode arrays 180 are capable of generating data at rates that exceed the data transmission capabilities of currently existing wireless communication protocols. For example, in some embodiments described above, the neural device 110 can include an electrode array 180 having 1,024 channels that are capable of recording at 20 kHz, which generates data at a raw rate of more than 200 megabits per second (Mbps). In contrast, the data transmission bandwidth for Bluetooth Low Energy is capped at 2 Mbps. Accordingly, the rate at which such neural devices 110 are able to generate data exceeds the bandwidth of common wireless communication protocols by two to three orders of magnitude. Further, this wireless communication bottleneck for neural systems will only widen over time because the ability to scale channel count and corresponding electrophysiologic data bandwidth is likely to grow much faster than the speed of power and thermally efficient wireless protocols.

Figure 4A:
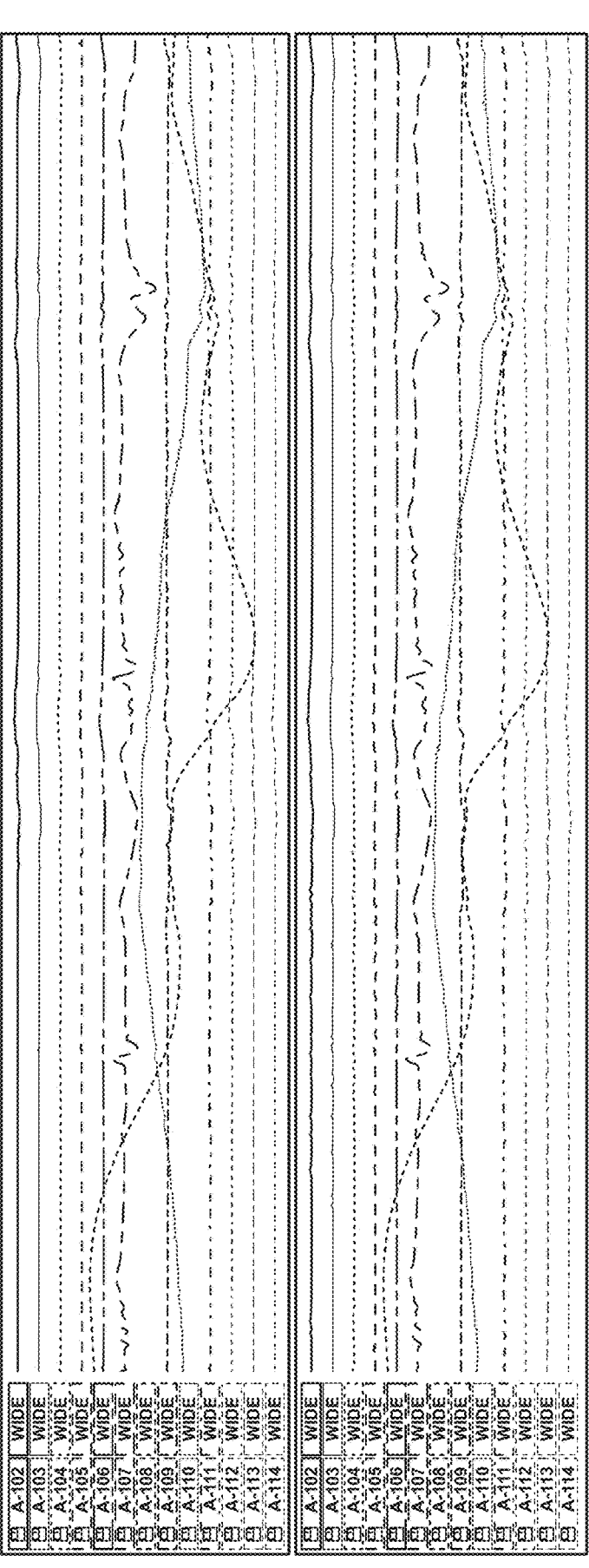
FIG. 4A depicts one line graph illustrating raw electrophysiologic data captured by a neural device and a second line graph illustrating the compressed form of the electrophysiologic data, in accordance with an embodiment of the present disclosure.
Figure 4B:
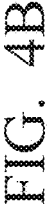
FIG. 4B depicts a series of line graphs illustrating raw electrophysiologic data captured by a neural device and the compressed form of the electrophysiologic data with increasing aggressive compression parameters, in accordance with an embodiment of the present disclosure.
Figure 4B:
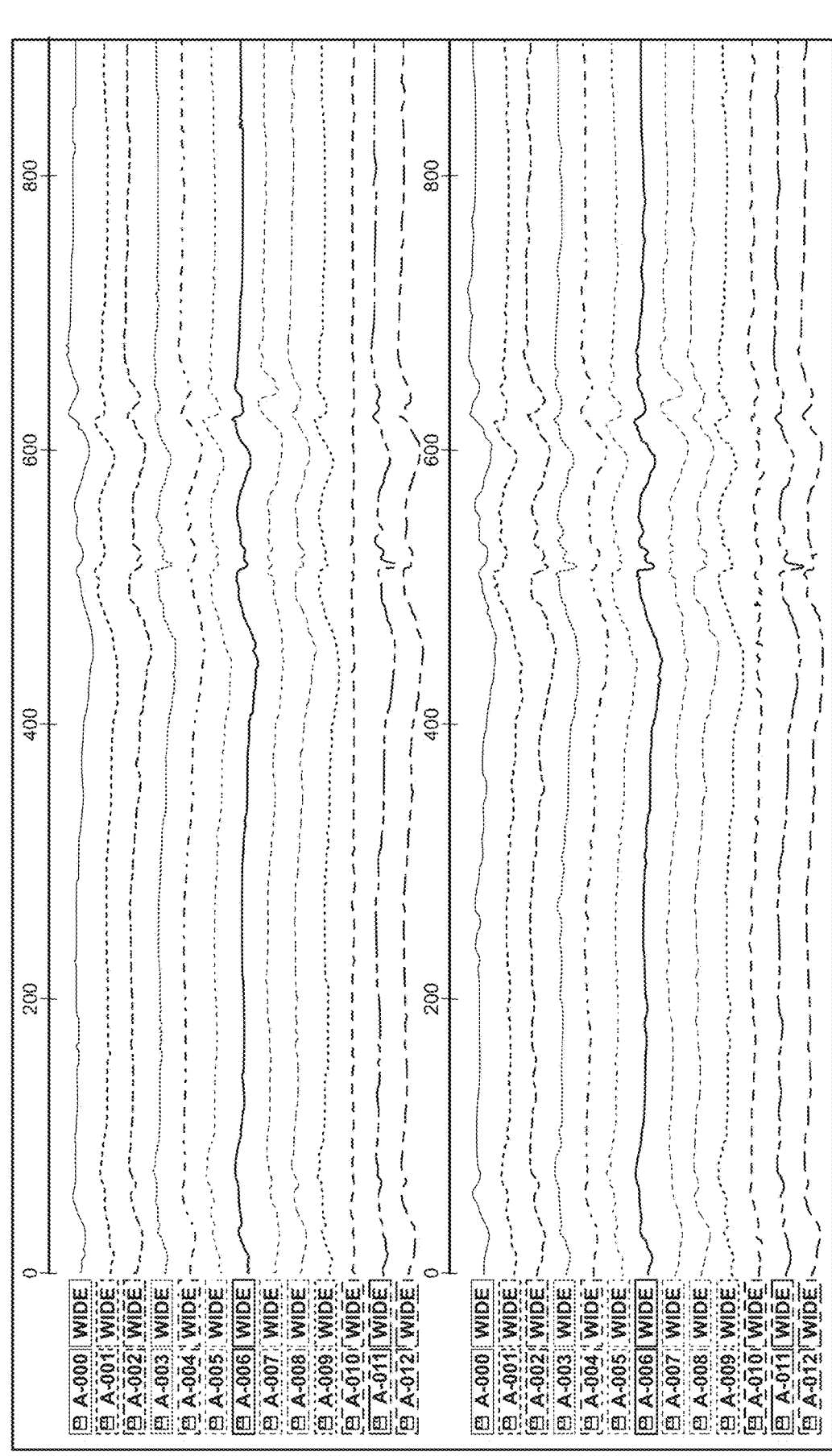

Because the electrodes of the array 180 are spaced at known, uniform intervals and neural voltage signals exhibit a high degree of temporal correlation, the data generated from the neural device 110 has similarities to video data. Notably, video data includes data points that are spaced at known, uniform intervals (i.e., the pixels) and video data exhibits a high degree of temporal correlation (i.e., the color of each pixel in a video frame is highly correlated to the color of the same pixel in the next video frame). To demonstrate the spatial and temporal structure of voltage signal data captured by the neural device 110, FIGS. 4A and 4B depict a series of color-coded voltage signals. FIG. 4A represents data captured using a 512-channel electrode array. The top line graph in FIG. 4A represents the captured raw electrophysiologic data and the bottom line graph represents electrophysiologic data compressed using the spatiotemporal algorithms and techniques described herein. Further, FIG. 4B represents data captured using a 1,024-channel electrode array. The top line graph in FIG. 4B represents the captured raw electrophysiologic data and the second, third, and fourth line graphs from the top represent electrophysiologic data compressed using the spatiotemporal algorithms and techniques described herein with increasingly aggressive compression (constant rate factors of 3, 10, and 20, respectively). Each shown voltage signal corresponds to data captured by one of the electrodes of the electrode array 180. Some video data codecs utilize spatiotemporal data compression algorithms that are based on the inherent spatial and temporal coherence of the data set. Because of the similarities between the types of data sets produced by the embodiments of neural devices 110 described above and video data, the system 100 can utilize spatiotemporal data compression algorithms, such as the H264 or H265 compression algorithms, to compress the data generated from the neural device 110 to a sufficient degree that it can be communicated wirelessly and in a substantially lossless manner. Accordingly, the embodiments described herein can beneficially optimize data compression and overcome wireless bottlenecks inherent in neural recording systems. Various data compression techniques have been utilized in brain-computer interfaces; however, spatiotemporal data compression algorithms have not been utilized to date. Notably, there are no inherent properties for neural signal data suggesting that it would behave in a manner similar to video data that would have prompted one to utilize spatiotemporal data compression algorithms for compressing neural signal data. Rather, the similarities between neural signal data and video data only become apparent due to the structure of the electrode arrays 180 described herein. The structure of the electrode arrays 180 dictates the structure of the neural signal data by providing spatial characteristics to the time-varying neural signal data from the arrangement of the electrodes (i.e., channels), which in turn provides both spatial and temporal time-varying characteristics to the neural data that would be appropriate to be compressed using spatiotemporal data compression algorithms (e.g., H264 or H265). Further, spatiotemporal data compression algorithms would not be appropriate to use for many other types of brain-computer interfaces. For example, some brain-computer interfaces utilize penetrating probes where the electrodes lie along the length of the probes (generally, at a defined spacing) that penetrate the surface of the brain. These penetrating brain-computer interfaces form complex three-dimensional structures; accordingly, the data from such interfaces do not map cleanly to a two-dimensional data structure similar to video. Accordingly, a representation of the neural data stream in those brain-computer interfaces would not be similar to a video stream, which in turn would make spatiotemporal data compression algorithms (e.g., H264 or H265) unsuitable for compressing such data.

Figure 5B:
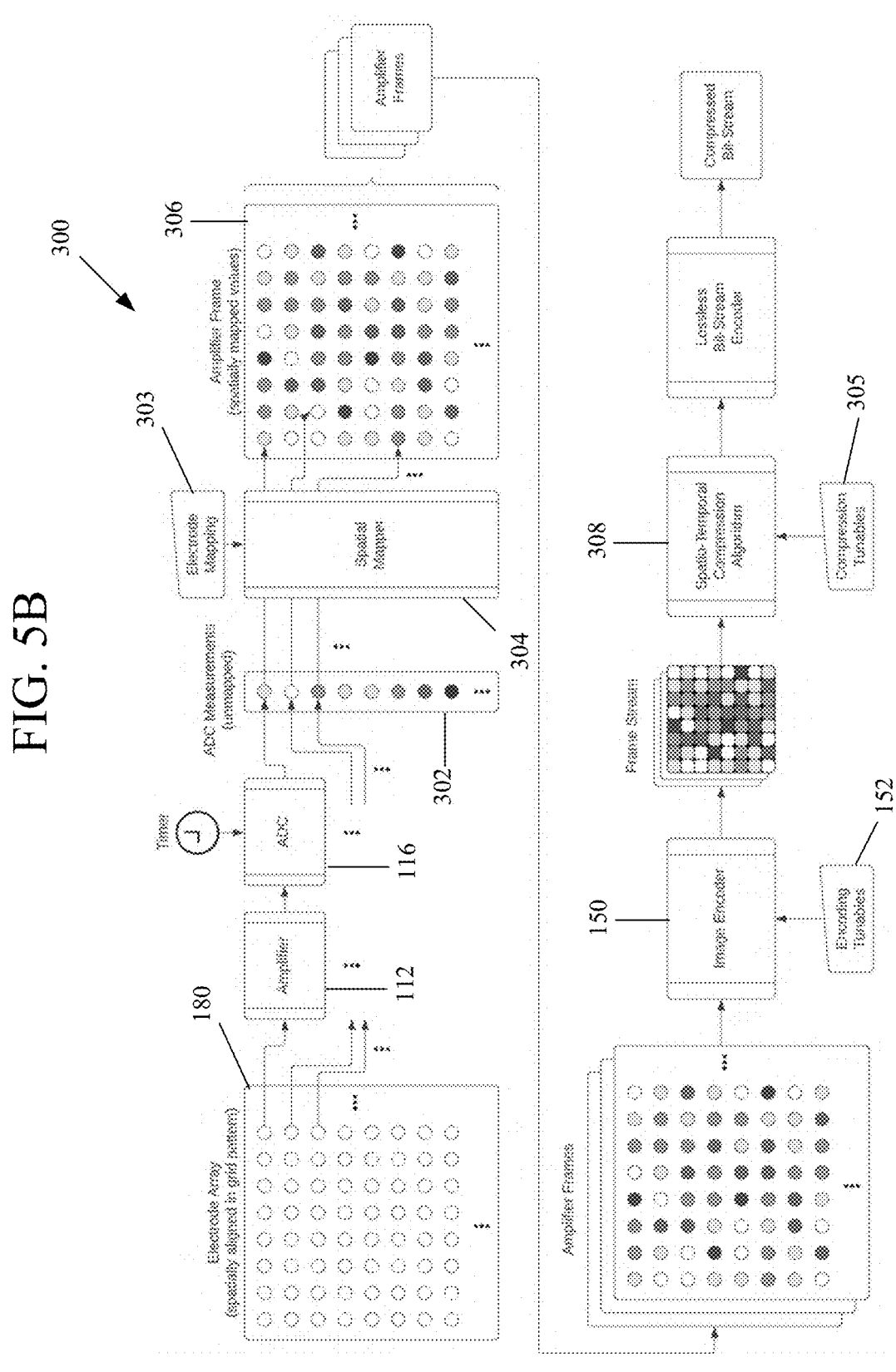
FIG. 5B depicts a detailed diagram of the data compression pipeline shown in FIG. 5A, in accordance with an embodiment of the present disclosure.

FIGS. 5A and 5B illustrate diagrams of a process 300 for compressing electrophysiologic data utilizing a spatiotemporal data compression algorithm. In one embodiment, the process 300 can be executed onboard the neural device 110 via one or more of the electronic components, such as the electrode-amplifier stage 112, the analog front-end stage 114, the ADC stage 116, the digital signal processing (DSP) stage 118, the transceiver stage 120, or a combination thereof. As described herein, the process 300 is executed by a controller 119 of the neural device 110; however, it should be understood that the "controller" refers to hardware, software, firmware, or any combination thereof that is capable of executing and performing the functions described below. In one embodiment, the controller 119 can include a custom-designed very large-scale integration (VLSI) integrated circuit. In another embodiment, the controller 119 can include a re-programmable FPGA.

Accordingly, the controller 119 executing the process 300 can receive 302 ADC voltage measurements (i.e., "snapshots") as measured by the electrode array 180. As shown in FIG. 5B, the controller 119 can be coupled to the electrode-amplifier 112 and ADC 116 stages for receiving the ADC voltage measurements. Further, the controller 119 can apply 304 an electrode mapping function to the received 302 voltage measurements to define the spatial characteristics of the voltage data. The applied 304 mapping function can be based on an electrode map 303 that defines the spatial coordinates of each of the electrodes and, accordingly, each channel of the received 302 voltage measurements (noting that each channel of the voltage measurements corresponds to one of the electrodes of the array 180). The electrode map 303 can be stored in a memory of the neural device 110 or embodied in hardware thereof. After application 304 of the electrode map 303, the controller 119 can thereby generate 306 a series of spatially mapped voltage measurements. Further, the voltage measurements can be temporally organized into a series of frames. Therefore, the mapped voltage measurements include both spatial and temporal data.

In some embodiments of the process 300, such as is shown in FIG. 5B, the controller 119 can further tile multiple of the spatially mapped frames of the voltage signal data into a single frame (i.e., a "macro frame") prior to compression. It can be beneficial to tile multiple frames together into a macro frame because this allows for the spatial symmetries between frames to be leveraged to maximize the buffer space utilization for the spatiotemporal data compression algorithm, which is described in greater detail below. In particular, tiling frames allows for the buffer to be filled more completely, which in turn improves compression and throughput for hardware accelerated encoders. In one experimental implementation, tiling multiple frames into a macro frame in a two-by-two grid resulted in a 2× improvement relative to implementations not utilizing macro frames.

In some embodiments of the process 300, the spatially mapped frames of the voltage signal data can be represented in color. In other embodiments, the spatially mapped frames of the voltage signal can be represented in greyscale. Embodiments where the voltage signal frames are encoded in greyscale prior to application of the spatiotemporal compression algorithm can be beneficial because greyscale can promote more efficient compression and improved signal integrity. Notably, current spatiotemporal compression algorithms used for video compression are generally tuned to preserve the video color quality as observable by humans by mixing the color channels of adjacent pixels. However, mixing the color channels in applications such as are described herein (i.e., compression neural voltage signal data) can be undesirable because compensating for this inherent tuning by the video compression algorithm requires a splitting of higher and lower order bits into different color channels, which in turn increases processing requirements. In short, higher and lower order bits must be split into different color channels to compensate for video compression algorithm tuning in 12-bit RGB pixel encoding because 4 bits are allocated to each of the color channels and perturbations in the encoding of each of the color channels due to the smoothing algorithm can create effectively significant differences from the original 12-bit values. Therefore, the voltage signal frames can be represented in greyscale in order to obviate this requirement inherent to color compression using spatiotemporal compression algorithms. In some experimental implementations, neural voltage signal data frames were represented in greyscale and compressed with either 10 bits for H264 or 12 bits for H265 with favorable results.

In some embodiments, such as in the embodiment shown in FIG. 5B, the amplifier frames can be processed via an image encoder 150 that encodes the amplifier frames into a frame stream pursuant to various tunable encoding parameters 152. The frame stream could then be processed via the spatiotemporal compression algorithm described below.

Accordingly, the controller 119 can compress 308 the spatially mapped voltage measurements using a spatiotemporal data compression algorithm. In various embodiments, the spatiotemporal data compression algorithm can include H.264, H.265, AV1, or VC-1. In some embodiments, the controller 119 can compress 308 the spatially mapped voltage measurements using combinations of data compression algorithms. For example, the spatially mapped voltage measurements can be compressed using a spatiotemporal data compression algorithm in combination with a secondary data compression algorithm, such as DEFLATE. The compressed data stream can be transmitted (e.g., via the transceiver 120) to an external device 130 for processing or storage thereon. In some embodiments, the compression by the spatiotemporal data compression algorithm could be controlled pursuant to various tunable compression parameters 305. In one embodiment, the tunable compression parameters 305 could include a constant rate factor (CRF) that controls the aggressiveness of the data compression. For example, a CRF of 3 could correspond to light compression, a CRF of 10 could correspond to medium compression, and a CRF of 20 could correspond to aggressive or heavy compression. The CRF could be controlled by balancing preferences for preserving data integrity vs. minimizing the size of the compressed data.

The process 300 and techniques described herein utilizing spatiotemporal algorithms can be implemented in combination with neural devices 110 having various array sizes. For example, the process 300 can be utilized in combination with a 512-channel neural device 110, such as is shown in FIG. 3A, or a 1,024-channel neural device 110, such as is shown in FIG. 3B. In particular, the techniques described herein are applicable to arrays having electrodes arranged in a spatially repeated or uniform manner, irrespective of the number of electrodes and/or size of the electrode array.

The spatiotemporal compression techniques described herein can further utilize a digital data quantization/bit-width and numerical representations of the electrophysiologic data, which can be tailored to the signal-to-noise ratio of the signal source to eliminate unnecessarily wasted power caused by switching activity in utilized sections of the data and computational paths. In particular, only a threshold amount of variance in the electrophysiologic data is physiologically relevant. If the electrophysiologic data does not exhibit at least a defined threshold amount of variance, then the variance can be characterized as noise (and, thus, not physiologically relevant). Accordingly, one can select a bit representation to effectively filter out small variations in the electrophysiologic signal data that cannot be physiologically relevant, which is both power and computationally efficient. Stated differently, if one were to represent the range of measurable voltages (e.g., −10 mV to +10 mV) using a 12-bit representation, the smallest variation one can possibly encode is approximately 0.005 mV. However, it may not be computationally efficient to encode to such precise voltage values because such small voltage variations may not be physiologically relevant. Correspondingly, in a 10-bit representation, the smallest variation one can encode for is approximately 0.02 mV. As long as the variation in the signal for a physiologically relevant event is significantly larger than what can be encoded, the loss of resolution from using a smaller bit representation should be inconsequential for downstream applications. Because it is more computationally efficient to use smaller bit representations, utilizing a reduced number of bits to represent the voltage measurement of the neural signal data can be more efficient in terms of hardware implementations and processing requirements, without impacting the overall accuracy and precision of the downstream electrophysiologic sensing. Further, spatiotemporal data compression techniques are intrinsically low latency, which is desirable to enable accurate, closed loop control for neural decoding and stimulation.

Experimental Results

Figure 6B:
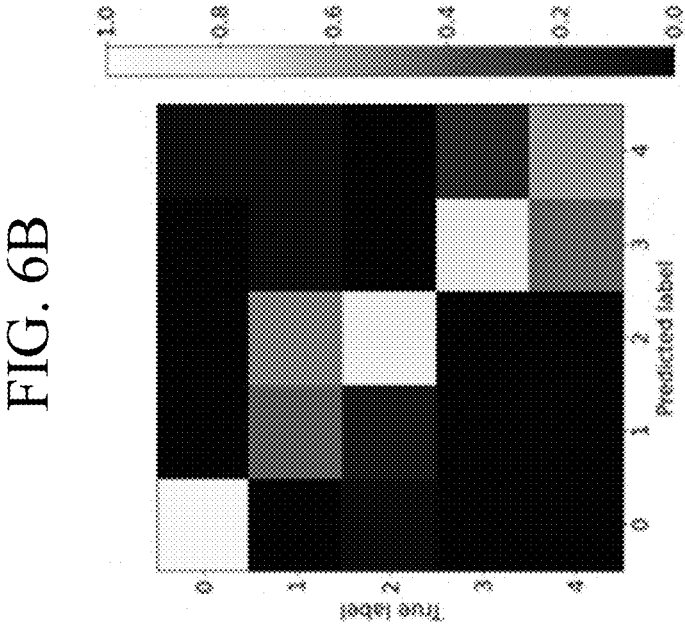
FIG. 6B depicts a confusion matrix for the neural decoding model trained using the same electrophysiologic data as in FIG. 6A that was compressed using a spatiotemporal compression algorithm, in accordance with an embodiment of the present disclosure.
Figure 6A:
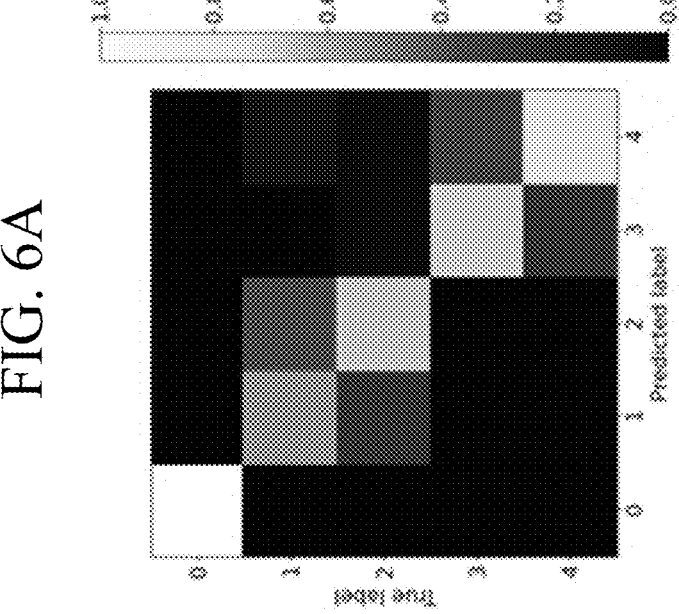
FIG. 6A depicts a confusion matrix for the neural decoding model trained using uncompressed, raw electrophysiologic data, in accordance with an embodiment of the present disclosure.

In operation, the systems and methods for compressing electrophysiologic data captured by the neural devices 110 described herein were experimentally validated by testing the effects of the data compression on downstream applications utilizing the compressed data. In one implementation, a neural network was trained to decode somatosensory stimuli applied to multiple locations on the pig rostrum using both uncompressed, raw electrophysiologic data and the same data that had been compressed using the techniques described herein and then decompressed. FIG. 6A shows a confusion matrix for the neural decoding model trained using uncompressed, raw electrophysiologic data, whereas FIG. 6B shows a confusion matrix for the neural decoding model trained using the same electrophysiologic data that was compressed using the techniques described herein and then decompressed. Notably, the overall accuracy of the neural decoding model was identical (72.5%) in both experiments, which indicates that any data lost using the process 300 described above is not required to achieve high accuracy neural decoding.

Typical lossless block compression techniques currently in use with neural device systems 100 generally provide approximately 2-4× compression. However, implementations of the process 300 described above were able to provide 35× or higher compression in a substantially lossless manner, with proper tuning (e.g., tiling of electrode channels in the frames). Table 1 below sets forth compression ratios that were achieved on 17 different datasets for an implementation of the process 300 utilizing a 12-bit grayscale pixel format, HEVC (H.265) codec with Main 10 profile (which is a commonly supported default profile implemented in hardware), and a CRF of 3 (which represents light compression aggressiveness). As can be seen, the techniques described herein were able to achieve compression ratios of 43× to 135×. In sum, the techniques described herein have been found to provide significantly improved compression for electrophysiologic data in neural device systems 100, without impacting the ultimate efficacy of the data after decompression.

TABLE 1

| Uncompressed (bytes) | Compressed (bytes) | Compression Ratio |
|---|---|---|
| 13539213312 | 286153473 | 47.31 |
| 1982595072 | 15120190 | 131.12 |
| 8630566912 | 171579530 | 50.30 |
| 1266941952 | 24987451 | 50.70 |
| 9133883392 | 176439419 | 51.77 |
| 9097183232 | 85324481 | 106.62 |
| 1803026432 | 13312342 | 135.44 |
| 13486784512 | 163243358 | 82.62 |
| 2010120192 | 34538387 | 58.20 |
| 8550612992 | 109274146 | 78.25 |
| 1395392512 | 16897587 | 82.58 |
| 9052618752 | 104473392 | 86.65 |
| 9013297152 | 102506118 | 87.93 |
| 115310592 | 2661928 | 43.32 |
| 8550612992 | 109274146 | 78.25 |
| 9052618752 | 104473392 | 86.65 |
| 9013297152 | 102506118 | 87.93 |

Further, FIGS. 7A-7C illustrate confusion matrices for the neural decoding model trained using uncompressed, raw electrophysiologic data (FIG. 7A), data compressed with a spatiotemporal compression algorithm with moderately aggressive compression (CRF=10; FIG. 7B), and data compressed with a spatiotemporal compression algorithm with moderately aggressive compression (CRF=20; FIG. 7C). The neural decoding model in these instances was a convolutional recurrent neural network that was alternatively trained and validated on raw data and data compressed using the systems and methods described herein. As can be seen, the neural decoding model performs comparably when trained on even aggressively compressed data relative to when the model is trained on raw data, thereby indicating that the compression algorithms substantially maintain the fidelity of the data (i.e., perform in a substantially lossless manner). Accordingly, the spatiotemporal compression techniques described herein are able to compress neural data by a significant degree, thereby facilitating wireless communication of the neural data or otherwise reducing storage requirements for the neural data, without losing substantial information from the neural data.

This disclosure is not limited to the particular systems, devices and methods described, as these may vary. The terminology used in the description is for the purpose of describing the particular versions or embodiments only and is not intended to limit the scope of the disclosure.

The following terms shall have, for the purposes of this application, the respective meanings set forth below. Unless otherwise defined, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention.

As used herein, the term "implantable medical device" includes any device that is at least partially introduced, either surgically or medically, into the body of a subject and is intended to remain there after the procedure.

As used herein, the singular forms "a," "an," and "the" include plural references, unless the context clearly dictates otherwise. Thus, for example, reference to a "protein" is a reference to one or more proteins and equivalents thereof known to those skilled in the art, and so forth.

As used herein, the term "about" means plus or minus 10% of the numerical value of the number with which it is being used. Therefore, about 50 mm means in the range of 45 mm to 55 mm.

As used herein, the term "consists of" or "consisting of" means that the device or method includes only the elements, steps, or ingredients specifically recited in the particular claimed embodiment or claim.

In embodiments or claims where the term "comprising" is used as the transition phrase, such embodiments can also be envisioned with replacement of the term "comprising" with the terms "consisting of" or "consisting essentially of."

As used herein, the term "subject" includes, but is not limited to, humans and non-human vertebrates such as wild, domestic, and farm animals.

While the present disclosure has been illustrated by the description of exemplary embodiments thereof, and while the embodiments have been described in certain detail, it is not the intention of the Applicants to restrict or in any way limit the scope of the appended claims to such detail. Additional advantages and modifications will readily appear to those skilled in the art. Therefore, the disclosure in its broader aspects is not limited to any of the specific details, representative devices and methods, and/or illustrative examples shown and described. Accordingly, departures may be made from such details without departing from the spirit or scope of the Applicant's general inventive concept.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In addition, even if a specific number is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). In those instances where a convention analogous to "at least one of A, B, or C, et cetera" is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, et cetera). It will be further understood by those within the art that virtually any disjunctive word and/or phrase presenting two or more alternative terms, whether in the description, sample embodiments, or drawings, should be understood to contemplate the possibilities of including one of the terms, either of the terms, or both terms. For example, the phrase "A or B" will be understood to include the possibilities of "A" or "B" or "A and B."

In addition, where features of the disclosure are described in terms of Markush groups, those skilled in the art will recognize that the disclosure is also thereby described in terms of any individual member or subgroup of members of the Markush group.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. An implantable neural device comprising:
an electrode array, wherein the electrode array comprises a plurality of electrodes arranged in a uniform configuration; and
a controller configured to:
receive electrophysiologic signal data from the electrode array,
tile one or more frames of the electrophysiologic signal data based on spatial locations of electrode channels corresponding to the electrode array to define a macro frame,
compress the macro frame data based on the locations of the plurality of electrodes utilizing a spatiotemporal data compression algorithm to define compressed electrophysiologic signal data, and
transmit the compressed electrophysiologic signal data to an external device.

2. The implantable neural device of claim 1, wherein the spatiotemporal data compression algorithm is selected from the group consisting of H.264, H.265, AV1, and VC-1.

3. The implantable neural device of claim 1, wherein the plurality of electrodes comprise non-penetrating electrodes.

4. The implantable neural device of claim 1, wherein the plurality of electrodes are arranged in a grid.

5. The implantable neural device of claim 1, wherein the controller is further configured to represent the electrophysiologic data in greyscale prior for compression.

6. The implantable neural device of claim 1, wherein the controller is further configured to represent the electrophysiologic data in color prior for compression.

7. The implantable neural device of claim 1, wherein the compressed electrophysiologic signal data is transmitted wirelessly to the external device.

8. A system comprising:
an implantable neural device comprising:
an electrode array, wherein the electrode array comprises a plurality of electrodes arranged in a uniform configuration, and
a controller configured to:
receive electrophysiologic signal data from the electrode array,
tile multiple frames of the electrophysiologic signal data based on spatial locations of electrode channels corresponding to the electrode array to define a macro frame,
compress the macro frame data based on the locations of the plurality of electrodes utilizing a spatiotemporal data compression algorithm to define compressed electrophysiologic signal data, and transmit the compressed electrophysiologic signal data;

a computer system communicably coupled to the implantable neural device, the computer system comprising a memory and a processor, the memory storing instructions that, when executed by the processor, cause the computer system to:

receive the compressed electrophysiologic data from the neural device, decompress the electrophysiologic data, and provide the decompressed electrophysiologic data to a user.

9. The system of claim 8, wherein the spatiotemporal data compression algorithm is selected from the group consisting of H.264, H.265, AV1, and VC-1.

10. The system of claim 8, wherein the plurality of electrodes comprise non-penetrating electrodes.

11. The system of claim 8, wherein the plurality of electrodes are arranged in a grid.

12. The system of claim 8, wherein the controller is further configured to represent the electrophysiologic data in greyscale prior for compression.

13. The system of claim 8, wherein the controller is further configured to represent the electrophysiologic data in color prior for compression.

14. The system of claim 8, wherein the implantable neural device wirelessly transmits the compressed electrophysiologic signal data to the computer system.

\* \* \* \* \*